United States Patent [19]

Chen

[11] Patent Number: 4,768,020

[45] Date of Patent: Aug. 30, 1988

[54] HOT BODY INTRUSION ACTIVATED LIGHT CONTROL UNIT WITH DAYLIGHT PHOTOCELL DEACTIVATION OVERRIDE

[75] Inventor: Wen-Chin Chen, Taipei, Taiwan

[73] Assignee: Paul E. Yarbrough, Jr., Arlington, Tex.

[21] Appl. No.: 863,343

[22] Filed: May 15, 1986

[30] Foreign Application Priority Data

Dec. 24, 1985 [TW] Taiwan .............................. 74210976

[51] Int. Cl.⁴ .................................................. G08B 13/18
[52] U.S. Cl. .............................. 340/567; 250/214 AL; 250/342
[58] Field of Search ............... 340/565, 567, 600; 307/117; 250/214 AL, 342

[56] References Cited

U.S. PATENT DOCUMENTS

| | | | |
|---|---|---|---|
| 3,036,219 | 5/1962 | Thompson | 340/600 X |
| 3,886,352 | 5/1975 | Lai | 340/600 X |
| 4,021,679 | 5/1977 | Bolle et al. | 307/117 |
| 4,258,291 | 3/1981 | Scott et al. | 307/117 X |
| 4,275,303 | 6/1981 | Mudge | 250/342 |
| 4,344,071 | 8/1982 | Allen | 307/117 X |
| 4,364,030 | 12/1982 | Rossin | 340/567 |
| 4,523,095 | 6/1985 | Keller-Steinbach | 250/342 X |
| 4,612,442 | 9/1986 | Toshimichi | 340/567 X |
| 4,663,521 | 5/1987 | Maile | 340/567 X |

Primary Examiner—Joseph A. Orsino
Assistant Examiner—Brian R. Tumm
Attorney, Agent, or Firm—Warren H. Kintzinger

[57] ABSTRACT

A hot body activates, such as by a person or a car moving into an area scanned through a lens by a passive infrared detector, a light control system having an adjustable length turn on duration for each hot body intrusion turn on cycle. The light control system also includes a photocell deactivation sensor that is in a daylight deactivation circuit for the light control system with the light sensing photocell positioned behind a multifaceted scan zone lens, along with the infrared detector. A manually switch activated circuit is also provided with the light control system for an emergency blinking light mode of operation as an alarm.

8 Claims, 7 Drawing Sheets

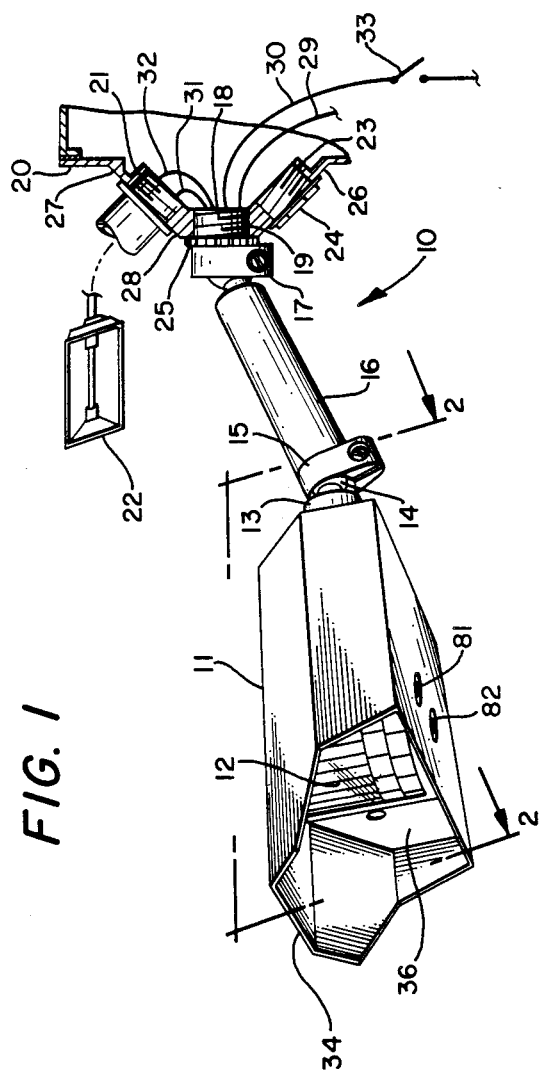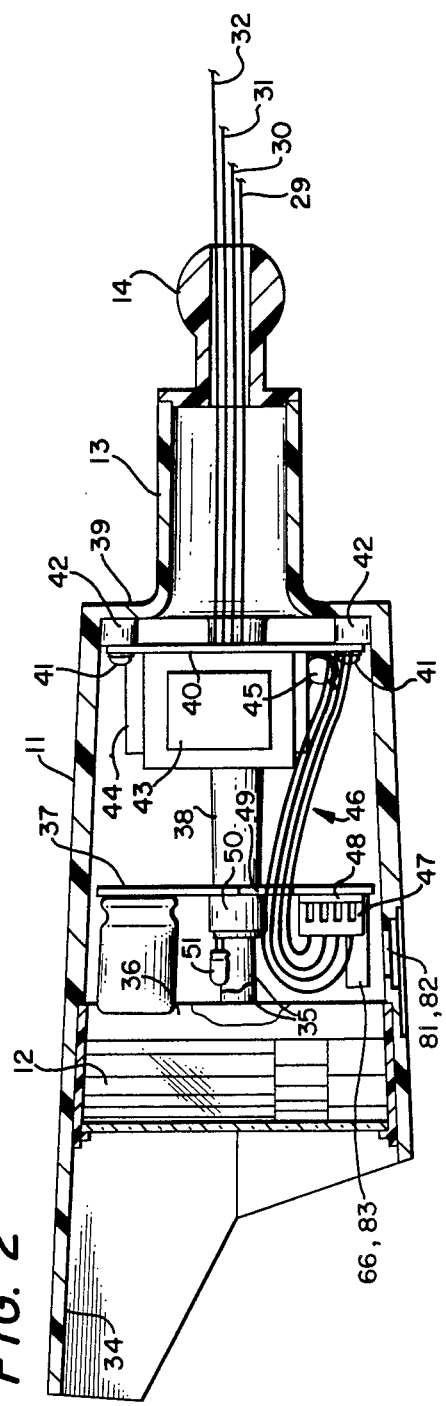

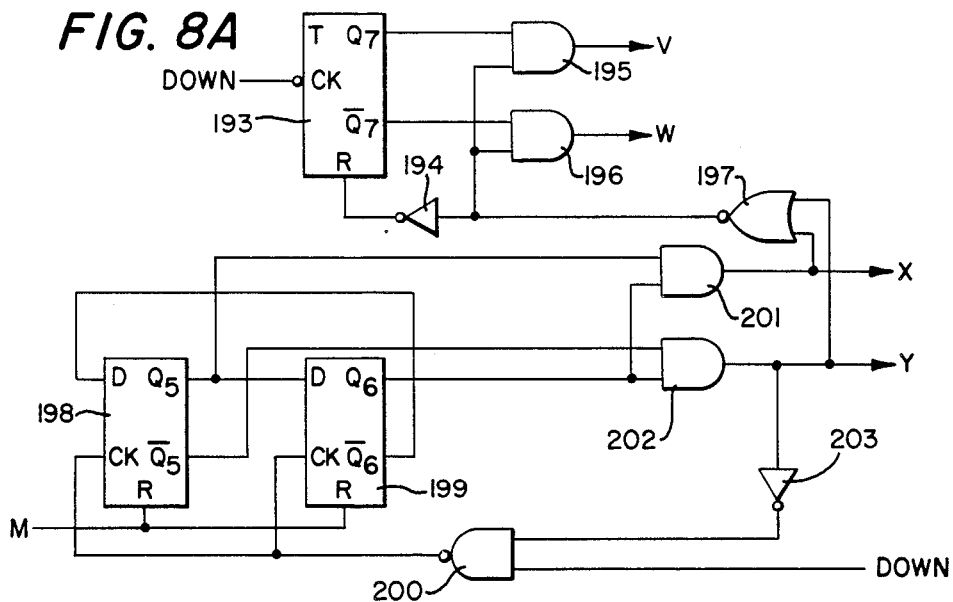
FIG. 8A
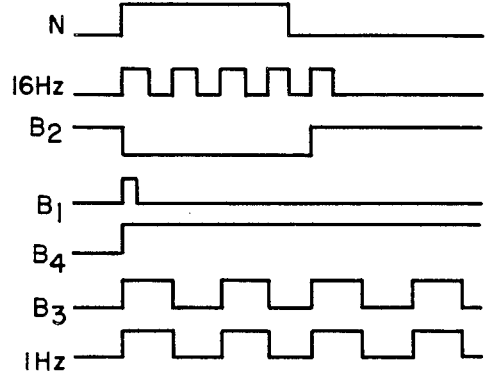
FIG. 8B
| $Q_5$ | $Q_6$ | FUNCTION |
|---|---|---|
| 0 | 0 | — |
| 1 | 0 | W/V MODE |
| 1 | 1 | X MODE |
| 0 | 1 | Y MODE |
FIG. 9B
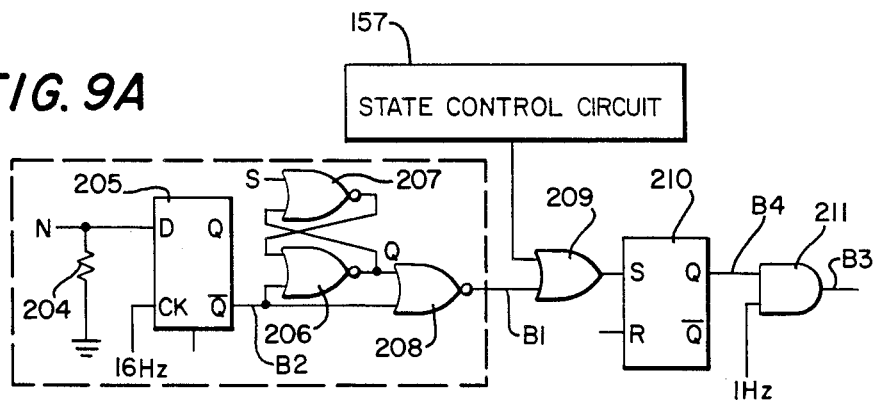
FIG. 9A

HOT BODY INTRUSION ACTIVATED LIGHT CONTROL UNIT WITH DAYLIGHT PHOTOCELL DEACTIVATION OVERRIDE

This invention relates in general to exterior night time lighting security for homes and businesses, and more particularly to a hot body intrusion activated light control unit with daylight photocell deactivation override also including a manual switch activated emergency mode of operation.

BACKGROUND OF THE INVENTION

There are many yard and driveway lighting systems that have been devised through the years along with other exterior illumination systems. Some are lighted continuously and some are lighted all night long through the hours of darkness using power through many times when lighting is not needed resulting in power consumption expense and waste. Further, many of these pre-existing light systems are complex, expensive, and require excessive maintainance. Safety and security are also important considerations with properly activated and deactivated illumination an effective burglary deterrance. Bad weather is also a consideration in that a home owner driving to and from his garage should not have to get out in the weather to turn a lighting system on or off. Ease of installation is important particularly for builders with in wall wiring and inside to outside connection for an outdoor lighting system. With inadequate or no outdoor lighting it can be hazardous in backing a vehicle out of a driveway and when driving back into a driveway to a garage an illuminated full scan view of the drive at night is desired in giving a good feeling of awareness. Many of the previously existing problems in outdoor driveway lighting during evening and night hours of darkness are answered with an illumination system switch activated by the opening of a garage door and automatically shut off with closing of the garage door, and with shut off during daylight hours by a light sensing control device.

SUMMARY OF THE INVENTION

It is, therefore, a principal object of this invention to provide a hot body intrusion activated light control unit having daylight photocell deactivation override.

Another object is to provide such a control system for outdoor lighting that is relatively inexpensive and reliable with substantially no maintainance required.

Still another object is to provide such a lighting system with manual control circuitry contained in a control box easily mounted in a garage inside wall.

Another object is to provide such an outdoor lighting system yielding significant energy savings that is activated and deactivated during hours of darkness by hot body intrusion and by manual control.

A further object is to provide such an outdoor lighting system with optimized security for the user.

Features of the invention useful in accomplishing the above objects include, in a hot body intrusion activated light control unit having daylight photocell deactivation override, a light control system having an adjustable length turn on duration for each hot body intrusion turn on cycle and for each manual turn on cycle. The light control system utilizes both a passive infrared detector and a light sensing photocell mounted side by side on a circuit board positioned behind a multi scan zone lens within a protective housing with the lens forming part of the protective housing. Scan zones projected through the lens and impinging on the sensing face of said passive infrared detector are such that when a hot body of sufficient heat intensity such as a person or a car with a hot engine compartment moves into a scanned area the passive infrared detector circuit is activated for turn on of the system light unless the system is deactivated by the daylight deactivation circuit with daylight having increased to above a predetermined set intensity level. A manually activated switch provides for manual turn on of the system light, floodlight or a plurality of system lights, and with appropriate manipulation for an emergency blinking light mode of operation as an alarm. The passive infrared detection light control system housing is mounted with a mounting tube equipped with opposite end ball joints and a mounting screw end for mounting in a wall where desired. The ball joints that are adjustable facilitate direction aiming adjustment of the lighting control housing for scanning a particular desired area and may be tightened for position lock. The unit may be mounted to scan a back yard or front yard, a driveway and sidewalk area such as to be activated by people coming along a sidewalk or by prowlers moving into the scanned area.

A specific embodiment representing what is presently regarded as the best mode of carrying out the invention is illustrated in the accompanying drawings.

BRIEF DESCRIPTION OF THE DRAWINGS

In the drawings:

FIG. 1, represents a perspective view of a passive floodlight control unit in a symbolized mounting to a wall junction box with wiring through a wall mounted manual switch and wiring to a floodlight;

FIG. 2, a cut away and sectioned view of the passive infrared detector light control unit of FIG. 1, showing the interior of the housing, a circuit board mounting the passive infrared detector and the photocell daylight deactivation sensor along with other discrete components and their positioning behind the multi scan zone lens mounted in the housing;

FIGS. 8A and 8B, a state control logic circuit and a related function table; and, FIGS. 9A and 9B, an emergency state switch activated circuit and a related family of waveforms.

Figure 3:
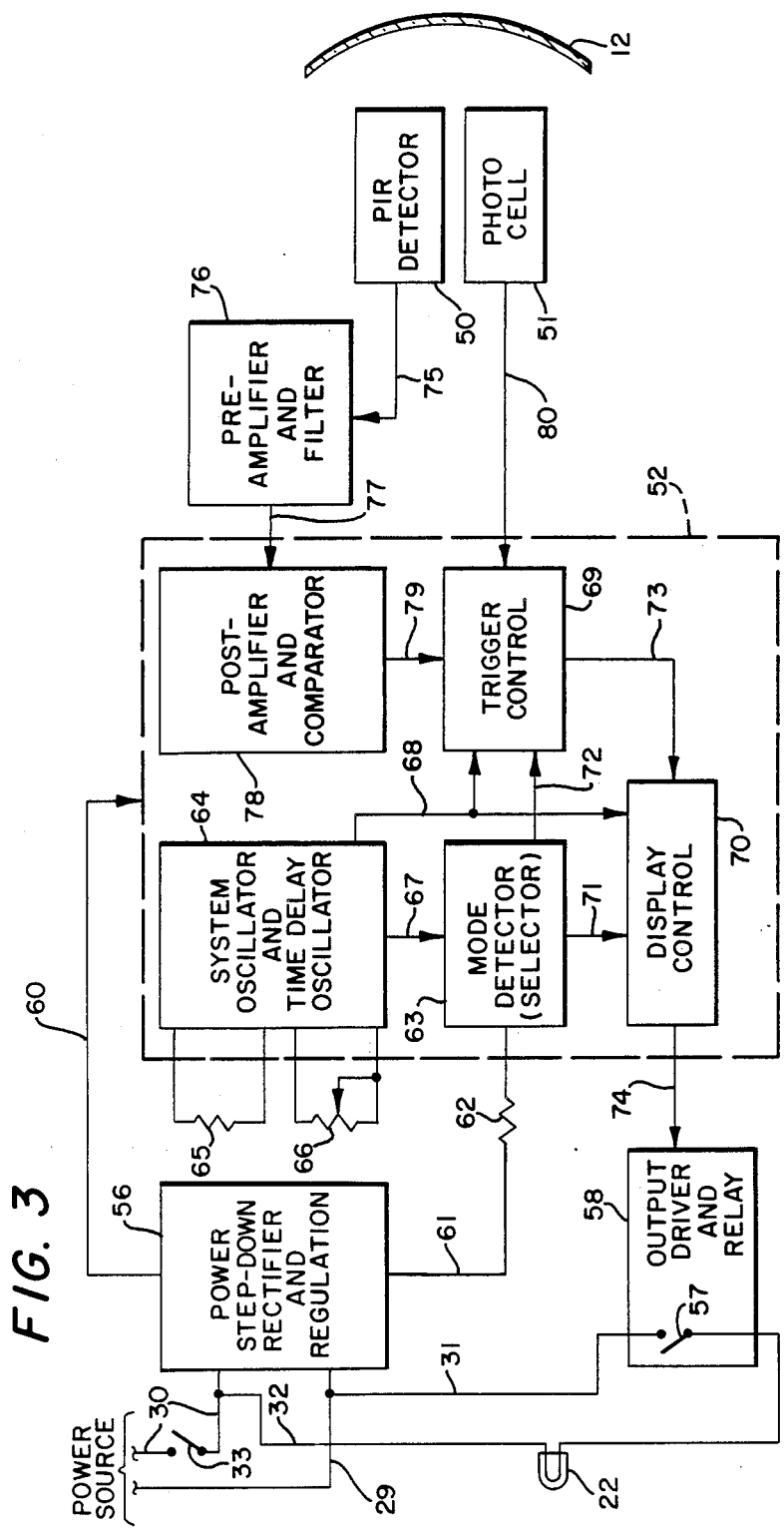
FIG. 3, a system function block diagram of the hot body intrusion activated light control system with daylight photocell deactivation override.
Figure 4A:
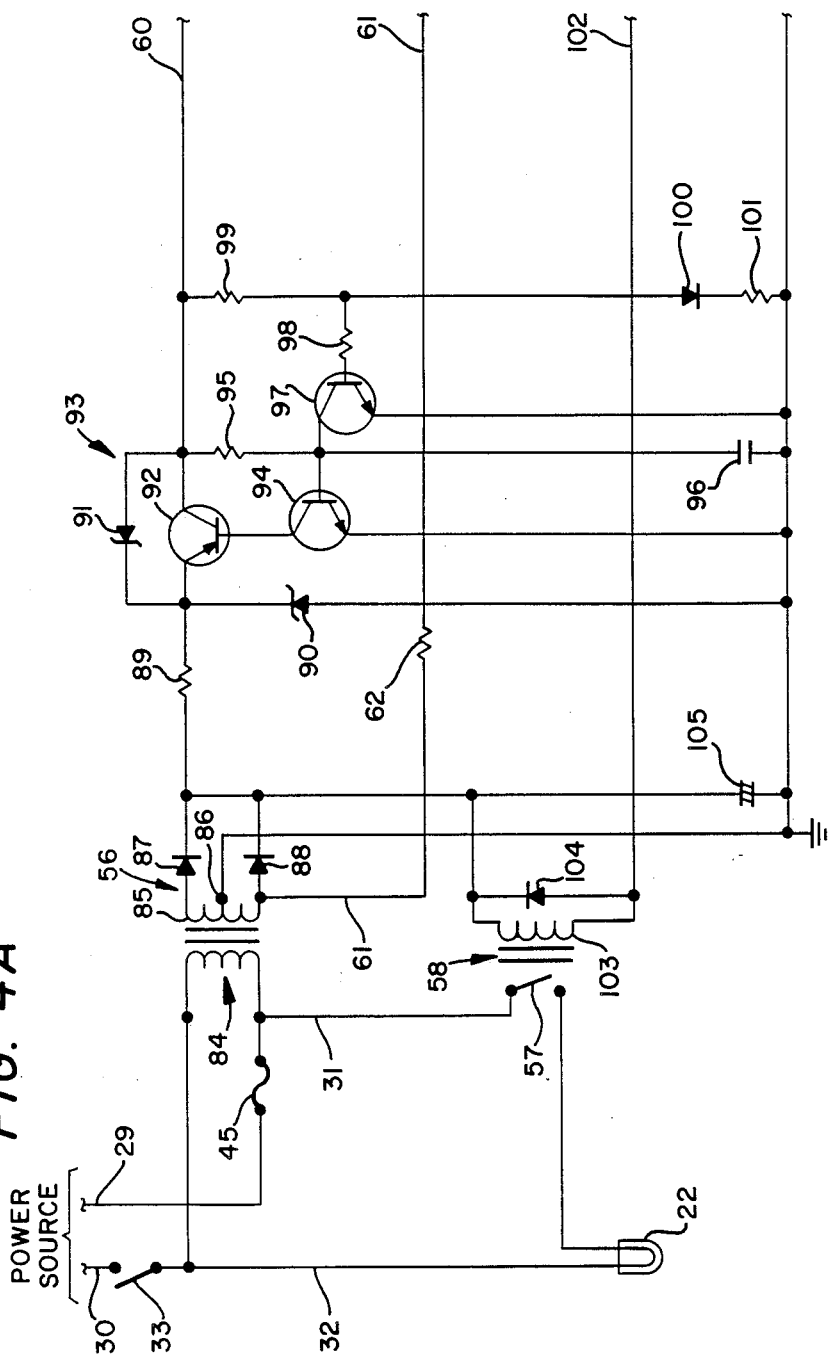
FIGS. 4A and 4B, a schematic showing of the passive infrared detector activated light control system with daylight photocell deactivation override.
Figure 4B:
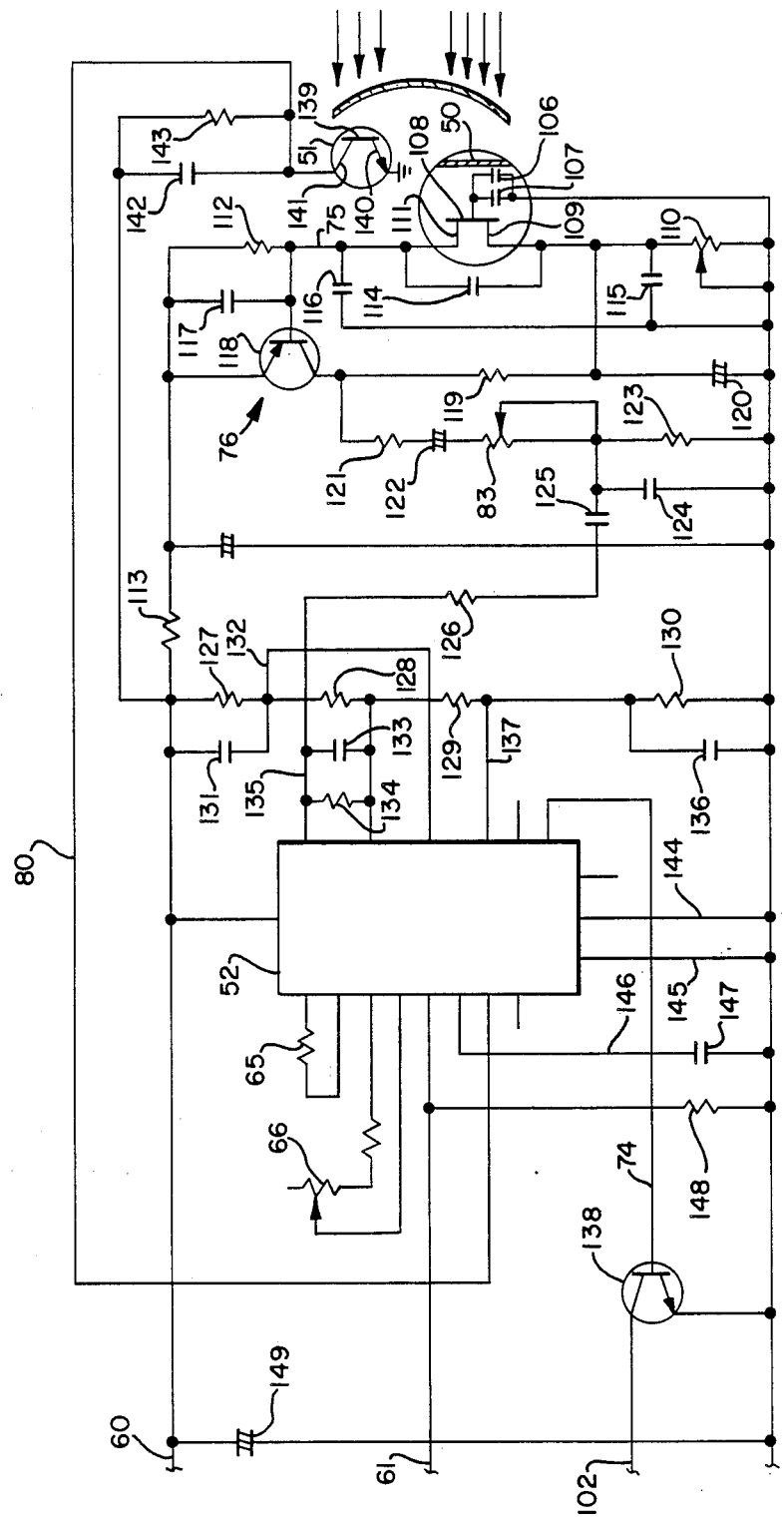

Referring to the drawings:

DESCRIPTION OF THE PREFERRED EMBODIMENT

The hot body intrusion activated light control unit 10 of FIGS. 1 and 2 are shown to have a control circuit housing 11 with a front electromagnetic wave passing window 12 in the form of a multi-zone Fresnel lens with wide angle coverage. The control circuit housing 11 is provided with, at the back, a neck projection 13 mounting a ball joint ball 14 that is part of ball joint 15 connection to mounting tube 16 having a ball joint 17 connection to a threaded end 18 that may be threaded into a threaded opening 19 of control unit 10 mounting plate 20 that is also provided with a threaded opening 21 for mounting, in like manner, a light structure 22. The mounting plate 20 is provided with an additional threaded opening 23 that may be closed by a plug 24 or used for mounting an additional lighting fixture if needed. Actually the mounting tube 16 assembly and the control circuit housing 11 may be mounted in any one of the threaded openings 19, 21 and 23 with a light fixture mounted from one of the other threaded openings, or two light fixtures mounted from two of the other threaded openings. The threaded openings 19, 21 and 23 are provided on diverse faces of the mounting plate 20, a center face 25 for straight ahead mounting and two opposite angled faces 26 and 27 on an outwardly extended projection 28 of the mounting plate 20. This is provided in order that the hot body intrusion activated light control unit and light control fixture, or fixtures controlled for turn-on turn off by the light control unit, may be mounted in various orientations desired. It should be noted that the neck projection 13 from control circuit housing 11, the ball joint ball 14 of ball joint 15, the mounting tube 16 and the ball joint 17, and the ball joint threaded end 18, all in assembly, have open internal passage for extension therethrough of AC power lines 29 and 30 and two power turned-on turned-off lines 31 and 32 extended to light structure 22 (or light structures). A manual on off switch 33 is included on AC power line 30 that may be turned on permitting general operation of the light control unit 10 and after initial manual turn-on of the switch three seconds or more and then flip switching it off-on the unit is controlled only by the photocell for continuous turn on of the light during the dark of night time and off during daylight hours. If the switch is, from the unit off (or on) state, flipped on then (or if on) off three times the light control system is put into a manual override emergency state of operation. In the emergency state of operation the light control system is set to drive the light in a continuing series of on off lighting flashes indicating an alarm state. If, when the unit is in the photocell alone controlled state or the emergency state, flipping the switch from on off-on one time returns the unit to the initial general operation state. If, with the unit in the off (or on) state, the switch is quickly switched on-off on off and then on the unit is in a test state.

Within control circuit housing 11, that has a forward extending top overhand extension 34 providing weather overhead protection for the lens window 12, projections 35 extending to the rear from the lens mounting housing enclosure front wall 36 at opposite sides of the lens window 12 determine the spacing of circuit board 37 to the rear from wall 36. The circuit board 37 is enclosed between the rear ends of projections 35 and the front ends of mounting projections 38 extended forward from the rear wall 39 of housing 11 with screws inserted from the rear within projections 38, through the circuit board 37 and into threading within projections 35 to fasten the front wall 36 and rear wall 39 together and mount circuit board 37 (some mounting detail not shown). A rear circuit board 40 mounted at the internal rear of housing 11 by screws 41 threaded into housing bases 42 has opposite side openings through which projections 38 extend and mounts an AC power transformer 43, relay 44, and fuse 45 along with several additional discrete components from the front face thereof. A four wire interconnect bundle 46 extends forward to a female connector 47 that connects to a four pin connector 48 mounted on the forward face of circuit board 37 with the four wires of bundle 46 passed through notch 49 above connector 48. Circuit board 37 mounts on its forward face the infrared detector 50 and the photocell 51 in spaced side by side relation for the proper impingment thereon of electromagnetic wave radiations passed through the lens window 12. The circuit board 37 also mountes, additionally, numerous discrete components on the foward face thereof including a circuit chip 52.

Referring also to FIGS. 3, 4A and 4B, and FIG. 5 these active circuit elements connect to various threshold trigger circuits and other circuit sections primarily carried by circuit board 37 with the rear circuit board 40 mounting primarily power supply components and circuitry. A 120 volt AC, 60 Hz supply is fed from a power source through two AC power lines 30 and 29, with a wall mounted switch 33 included in line 30, to an AC power step down, rectifier and regulator circuit 56. Branches 32 and 31 of lines 30 and 29 are connected through relay switch 57 of output driver and relay circuit 58 and through light 22 for illumination thereof when relay switch 57 is closed. Obviously, light 22 could be a plurality of lights connected either in series or in parallel in the circuit in place of one light. The rectified and regulated output from circuit 56 is applied through line 60 to circuit chip 52, and a step down AC signal line 61 extends from AC power circuit 56 through resistor 62 to a mode detector selector circuit 63 of chip 52. A system oscillator and time delay oscillator circuit 64, having out of chip connection to resistor 65 and adjustable resistor 66 that is a timing adjustment resistor, has an output connection through line 67 to mode detector selector 63 and an output connection through line 68 to both trigger control circuit 69 and display control circuit 70. The mode detector selector circuit 63 has an output connection through line 71 to display control circuit 70 and through line 72 to trigger control circuit 69. Circuit 69 has its output connection through line 73 to display control circuit 70 that has its output connected through line 74 to the output driver and relay circuit 58. The passive infrared detector 50 has a circuit connection through line 75 to preamplifier and filter circuit 76 that is connected through line 77 to post amplifier and comparator circuit 78 in chip 52 and via line 79 from circuit 78 as a trigger threshold signal input to trigger control circuit 69. The output from photocell 51 is passed through line 80 as an additional input to trigger control circuit 69.

Referring again to FIGS. 1 and 2 time adjustment opening 81 and sensitivity opening 82 are provided in the bottom of housing 11 in order that time adjustable resistor 66 and sensitivity resistor 83 as adjustable value resistors accessable with a tool for adjustment as desired when mounted in location in an outdoor on-off controlled lighting system.

Referring back to FIGS. 4A and 4B the AC power step down rectifier and regulator circuit 56 includes an AC step down transformer 84 having a secondary coil 85 with a center tap 86 connection to ground as a voltage potential reference source and with opposite ends connected to AC to DC rectifying diodes 87 and 88. The cathode of diode 87 is connected through resistor 89 to the cathodes of zener diodes 90 and 91 and to the emitter of PNP transistor 92 in power supply regulator circuit 93. The anode of zener diode 90 is connected to ground and the anode of zener diode 91 is connected to the collector of PNP transistor 92 that has a base connection to the collector of NPN transistor 94 with an emitter connection to ground and base connection to the junction of resistor 95 and capacitor 96 series connected between the collector of PNP transistor 92 and ground. The junction of resistor 95 and capacitor 96 along with the base of NPN transistor 94 is connected to the collector of NPN transistor 97 having an emitter connection to ground and a base connection through resistor 98 to the junction of resistor 99 and the anode of diode 100 series connected between the collector of PNP transistor 92 and resistor 101 connecting the cathode of diode 100 to ground.

An output driver line 102 connects to an end of relay coil 103 of circuit 58 and to the anode of diode 104 that has a cathode connection in common with relay coil 103 to the rectified output cathodes of diodes 87 and 88 and through polarized electrolytic capacitor 105 to ground. Passive infrared radiation detection capacitors 106 and 107 in the infrared detector 50 are connected to ground on one side. The other side of capacitors 106 and 107 are connected to the base of a solid state element 108 having a first electrode 109 connected to adjustable resistor 110 and a second electrode 111 connected via line 75 through, serially, resistor 112 and resistor 113 to line 60. Electrodes 109 and 111 are interconnected through capacitor 114 and through capacitors 115 and 116, respectively, to ground. Electrode 111 is also connected through capacitor 117 to the junction of resistors 112 and 113 and to the base of PNP transistor 118 having an emitter connection to the junction of resistors 112 and 113. The collector of transistor 118 is connected serially through resistor 119 and capacitor 120 to ground and the junction of resistor 119 and polarized electrolytic capacitor 120 is connected to the electrode 109 of solid state element 108. The collector of amplifier transistor 118 is also connected, serially, through resistor 121 polarized electrolytic, capacitor 122 and sensitivity adjustment resistor 83 to and through resistor 123 and capacitor 124 in parallel to ground. The junction of resistors 83 and 123 and capacitor 124 is connected through, serially, capacitor 125 and resistor 126 as an amplified and filtered passive infrared detector 50 signal input to chip 52. Resistors 127, 128, 129 and 130 are serially connected between DC voltage line 60 and ground with the junction of resistors 127 and 128 connected through capacitor 131 to line 60 and also as a passive infrared detector 50 signal comparator level setting line 132 input to chip 52. The junction of resistors 128 and 129 is connected as a passive infrared detector input to chip 52 with connections through capacitor 133 and resistor 134 in parallel to the chip 52 input line 135 from resistor 126. The junction of resistors 129 and 130 is connected through capacitor 136 to ground and through line 137 as a passive infrared detector 50 signal comparator level setting input to chip 52.

The relay output driver line 74 from chip 52 is connected to the base of NPN transistor 138, having an emitter connection to ground, for developing relay control bias output from the collector through output driver line 102 to relay coil 103. The photocell 51 having similarities to an NPN transistor with a light input biased base 139, an emitter 140 connected to ground, and a collector 141, connected through capacitor 142 and resistor 143 in parallel to DC voltage line 60, is connected through line 80 as the photocell input to chip 52. Voltage potential reference source (ground) line 144 and 145 connections are provided for chip 52. A power on reset connection line 146 of chip 52 is connected through capacitor 147 to ground. The AC step down signal line 61 in addition to its connection with chip 52 is connected through resistor 148 to ground. The rectified and regulated DC line 60 is also connected through polarized electrolytic capacitor 149 to ground.

Figure 5:
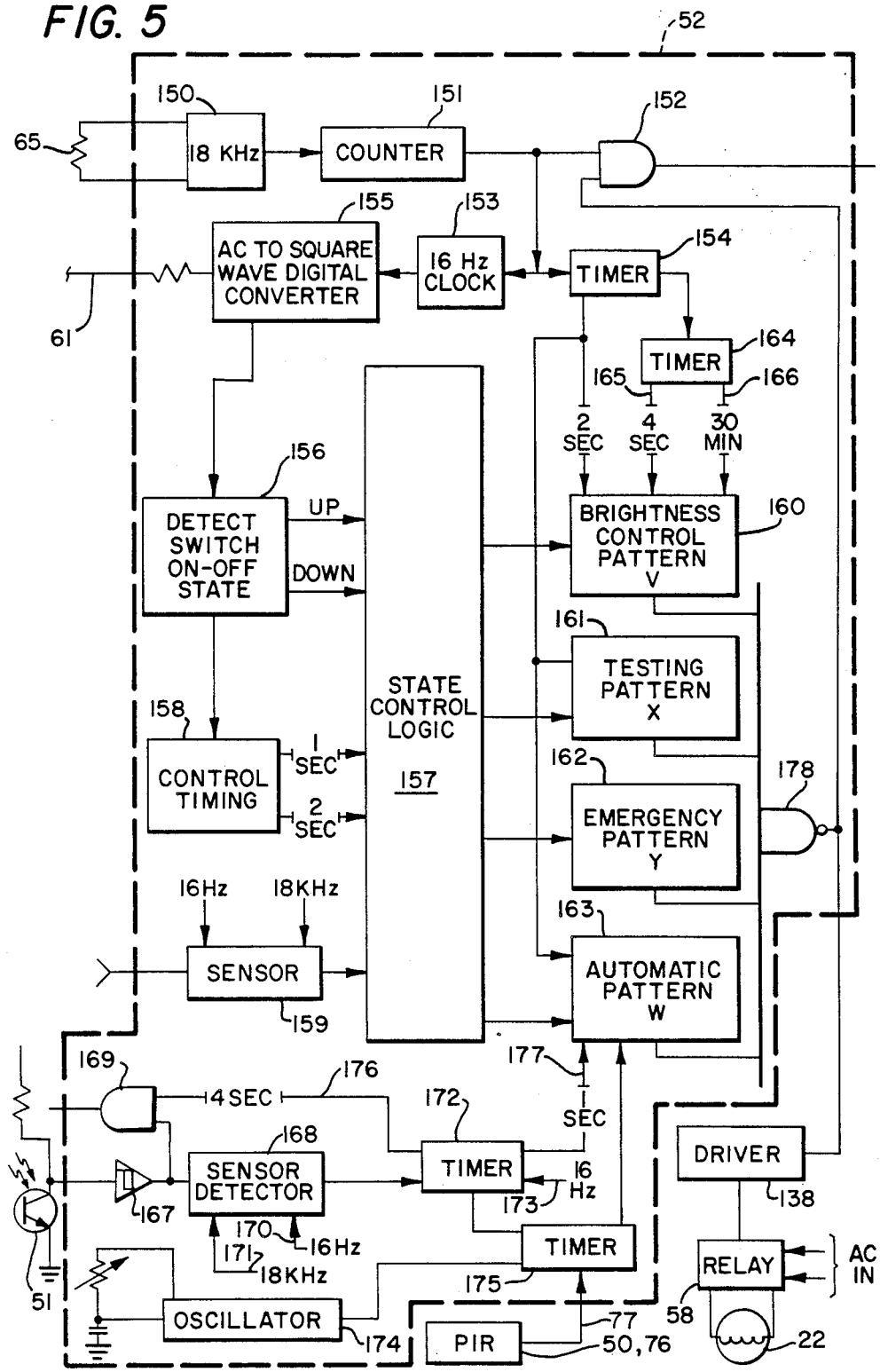
FIG. 5, a function block schematic showing of a chip used in the light control system shown in FIGS. 4A and 4B.

Referring now more in detail to the function block schematic showing of chip 52 in FIG. 5 the resistor 65 is shown to be connected to a 18 KHz oscillator 150 having an output connection to counter circuit 151. Counter 151 has an output connected as an input to two input AND gate 152 and also as an input to both 16 Hz clock circuit 153 and timer circuit 154. The 16 Hz output from clock circuit 153 is applied as an input to AC to square wave converter circuit 155 also receiving an AC step down signal from line 61. The converter circuit 155 has an output connection to a detect circuit 156 that detects the on-off state of switch 33, and provides "ON" and "OFF" state outputs applied as inputs to state control logic circuit 157, and an output applied as an input to control timing circuit 158 that has a one second timing output and a two second timing output applied as additional inputs to state control logic circuit 157. An emergency signal receiving circuit 159 also receiving 16 Hz and 18 KHz inputs develops an output also applied as an input to the state control logic circuit 157. Circuit 157 develops an output applied to brightness control pattern circuit 160, an output to testing pattern circuit 161, an output applied to emergency pattern circuit 162, and an output applied to automatic pattern circuit 163. Timer circuit 154 provides a two second waveform signal applied to each of the circuits 160, 161, 163 and also as an output to timer circuit 164 that has a four second output line 165 and a thirty minute output line 166 both to brightness control pattern 160. The photocell 51 is outCput connected through a Schmitt buffer 167 to sensing detector circuit 168 and to AND gate 169. The sensing detector circuit 168 also uses a 16 Hz input 170 and a 18 KHz input 171 in developing an output applied to timer circuit 172 also having a 16 Hz input 173. Oscillator circuit 174 generates a frequency signal applied as an input to timer circuit 175 that also receives an input through line 77 from passive infrared detector 50 and pre-amplifier and filter circuit 76. Timer circuit 175 provides an output to timer circuit 172 and a one minute to twenty minute signal output to automatic pattern circuit 163. The timer circuit 172 has a four second signal output line 176 to AND gate 169 and a one second output line 177 to automatic pattern circuit 163. The outputs of circuits 160, 161, 162 and 163 are applied as the four inputs to four input NAND gate 178 with the output applied to AND gate 152 and to driver 138.

The brightness control pattern V of circuit 160 is used in the detection of an external brightness threshold and uses photocell 51 as the detecting sensing element for this pattern. If this pattern is activated the light turn on control is biased off dependent on brightness change of external lighting.

The testing pattern X of circuit 161 provides test signals.

The emergency pattern Y is responsive to manual on-off repeated flipping of the wall switch 33 with, if the switch is quickly flipped on-off-on three or more times, the lighting control system going into an emergency state with a continuous oscillating pulse on and off lighting of light 22 occuring as an alarm function.

The testing and emergency pattern W of circuit 163 is used for testing the receiving signal of the passive infrared detector 50 and adjusting its direction and sensitivity properties.

Figure 6A:
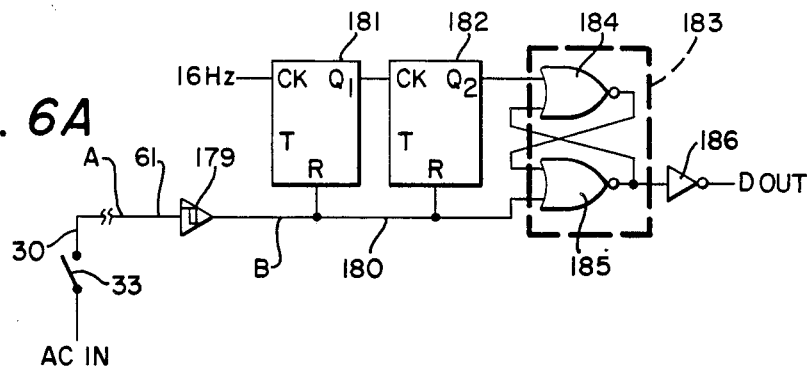
FIGS. 6A and 6B, circuit detail of a regulator section and a related family of waveforms.
Figure 6B:
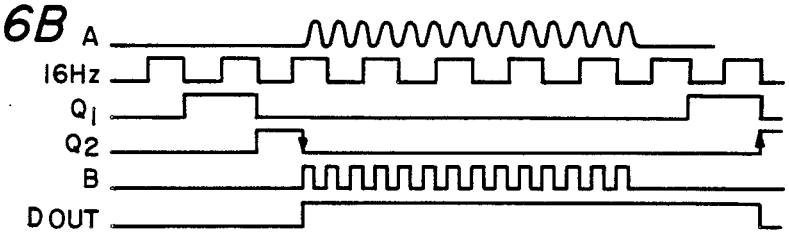

Referring now to the regulator section of FIG. 6A and the related waveform family of FIG. 6B, AC signalling passed through switch 33 and line 30 as translated to line 61 is as shown at point A the waveform input to Schmitt buffer 179. The resulting B waveform on line 180 out of Schmitt buffer 179 is applied as an input to the R terminals of flip-flops 181 and 182. Flip-flop 181 receives the 16 Hz square wave as a clock input to develop the $Q_1$ waveform as an output applied as the clock input to flip-flop 182 that in turn develops the $Q_2$ waveform. The $Q_2$ waveform is applied as the set (S) input to R-S flip flop 183 having the B waveform applied as the reset (R) input to R-S flip-flop 183 that is composed of two NOR gates 184 and 185 with the output applied to NOT gate 186 to produce the D out waveform. In the operation of this AC to digital conversion and switch bounce supression circuit when switch 33 is flipped open and then closed with the waveform B generated out of the Schmitt buffer 179 that regulates in saturation to produce the square waveform B from the A sinusoidal AC waveform at the same frequency. The two T-shaped flip flops 181 and 182 are so superimposed as to make the $Q_2$ output flip to a low voltage and simultaneously the D out waveform settled to a high voltage with the phase reversed by NOT gate 186. This circuit generates corresponding ascending waves and descending waves after the switch 33 turns on and off.

Figure 7A:
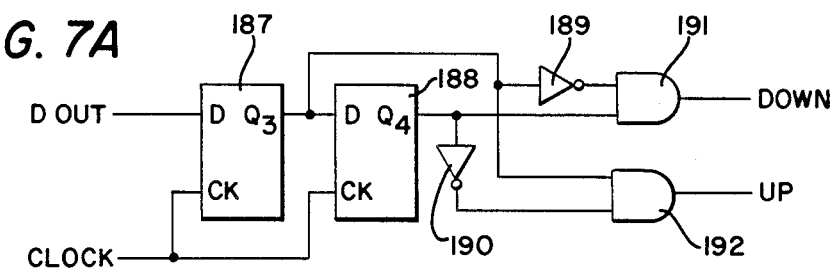
FIGS. 7A and 7B, a waveform edge detector circuit and a related family of waveforms.
Figure 7B:
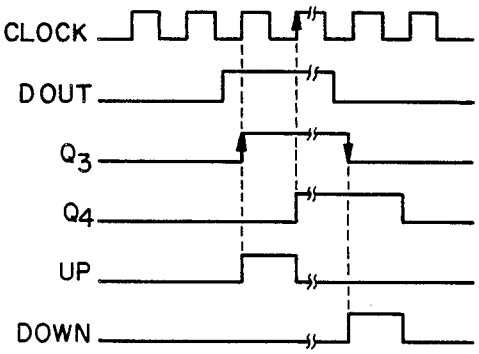

Referring also to the waveform edge detector circuit of FIG. 7A and the waveforms of FIG. 7B the circuit is comprised mainly of two D-shaped flip-flops 187 and 188, two NOT gates 189 and 190, and two AND gates 191 and 192. The D out waveform of FIGS. 6A and 6B is applied to the D input of flip-flop 187 that receives the clock square waveform as a clock input that is also applied as a clock input to flip-flop 188. The $Q_3$ output waveform from flip-flop 187 is the D input of flip-flop 188 and an input to NOT gate 189, and is also an input to AND gate 192. The $Q_4$ output waveform from flip-flop 188 is applied as an input to NOT gate 190, and also as an input to AND gate 191. These circuit connections and waveforms result in the UP square wave out of AND gate 192 and the DOWN square wave out of gate 191. In operation with the two series connected D-shaped flip-flops 187 and 188 the D out waveform pulses overlaps the time interval of pulses of the clock waveform so that $Q_3$ and $Q_4$ outputs are arranged in the order of front and rear so that the waveform output ends are changed according to the order of 00, 10, 11, 01. Then with the two NOT gates 189 and 190 and two AND gates 191 and 192 the UP and DOWN AND gate outputs are suitably corresponding pulse signals dependent on the ascending waveform edge and the descending waveform edge of the D out waveform. Thus using the edge detector of FIG. 7A the pulse number corresponding to the number of turns on-off of wall switch 33 is generated so that the push number of the switch is detected and a circuit count of the number one by one is made implementing selection of the required operational pattern.

The DOWN output waveform of the edge detector of FIG. 7A is applied as an input to the state control logic circuit of FIG. 8A in developing the function results set forth in the function table of Figure 8B with the descending edge of the waveform counted for selecting one of four outputs of the FIG. 8A logic circuit. The selection of an output is as a high voltage potential actuating a pattern circuit changing equipment operating patterns. In the FIG. 8A circuit the DOWN signal waveform is applied to the clock input of T-shaped flip-flop 193 and the output of NAND gate 194 is applied as an input to the R (reset) input of flip-flop 193 to develop $Q_7$ and $\overline{Q}_7$ outputs applied as inputs to AND gates 195 and 196, respectively. NOR gate 197 provides an output applied as the input to NAND gate 194 and as an input to AND gates 195 and 196 in producing the V and W outputs. An M signal input is applied as the R (reset) signal input to D-shaped flip-flops 198 and 199. The DOWN signal is also applied as an input the NAND gate 200 having an output applied as the clock input to flip-flops 198 and 199. The $\overline{Q}_6$ output of flip-flop 199 is applied back as the D input of flip-flop 198 and the $Q_5$ output of flip flop 198 is applied as the D input of flip-flop 199 and as an input to AND gate 201. The $\overline{Q}_5$ output of flip-flop 198 is applied as an input of AND gate 202 and the $Q_6$ output of flip-flop 199 is applied as an input to both AND gates 201 and 202. The X output of AND gate 201 is connected as an input to NOR gate 197 and the Y output of AND gate 202 is connected as an input to NOR gate 197 and to NOT gate 203 that has an output connection as an input to NAND gate 200. Based on the structure of the two D-shaped flip-flops 198 and 199 divide by four, and the system input M is a standard pulse signal with two second intervals so that the two flip-flops 198 and 199 are superimposed every two seconds.

When the state control logic circuit of FIG. 7A has not received any input sign the X and Y outputs are at low voltage potential with NOR gate 197 and NOT gate 194 also at low voltage potential. The T-shaped flip-flop 193 is inactive with the positive phase $Q_7$ and the reverse phase $\overline{Q}_7$, respectively, at low voltage potential and at high voltage potential. Through their connection to the two AND gates 195 and 196, the W output is at high voltage potential and the pattern associated therewith is activated and operates. Immediately after switch 33 has been turned on-off-on one time the DOWN input generates a pulse that actuates T-shaped flip-flop 193 one time to change the output with $Q_7$ and $\overline{Q}_7$ now, respectively, at high voltage potential and at low voltage potential. If the output V is at high voltage potential another operational pattern is entered. Although at switch 33 off intervals clock input to the two D-shaped flip-flops 198 and 199 are always simultaneously actuated at the same time with turn on. The reverse phase output $\overline{Q}_6$ of D-shaped flip-flop 199 originally at low voltage potential as input to the D terminal of D-shaped flip flop 198 results in the $Q_5$ and $Q_6$ outputs of D-shaped flip-flops 198 and 199 being at high voltage potential and at low voltage potential, respectively. This does not actuate AND gates 201 and 202 and they remain at their original state with the X and Y outputs at low voltage potential. After the wall switch 33 has again been turned on-off-on continued actuation makes the D input generate two pulses and the two D-shaped flip-flops 198 and 199 are actuated two times. The $Q_5$ and $Q_6$ outputs are at high voltage potential and the reverse phase output $\overline{Q}_5$ of D-shaped flip-flop 198 is at low voltage potential. The two inputs to AND gate 201 are at high voltage potential and make output X be at high voltage potential to actuate its receptive circuitry to the operate mode. At the same time this X output is applied as an input to NOR gate 197 so that its output is at low voltage potential and the AND gates 195 and 196 V and W outputs are blank and after the switch 33 has been flipped on-off-on two times the X output is at a high voltage potential. If the external switch is turned on-off-on three times the outputs of the two D-shaped flip-flops 198 and 199 are at low voltage potential and at high voltage potential, respectively, with as a result the Y output being at high voltage potential with the operational pattern of circuitry driven thereby actuated. After the phase of NOT gate 203 has been reversed the NAND gate 200 is blank, and when the circuitry is in this pattern made it cannot be influenced by switch 33. Then, if the switch 33 is flipped on-off-on three times it stays in this pattern assuring an emergency alarm mode. With the reset R input to the two D-shaped flip-flops 198 and 199 being controlled by the tuning pulse of the system the pulse generates a sign during each turning on-off-on of the switch 33 superimposing the two D-shaped flip-flops 198 and 199. An object is to distinguish two seconds with, if this time limit is exceeded, the switch on-off-on action seemingly being an incontinous closing and opening operation giving rise to wrong system actuation and not achieving desired operational states. Various operational states of $Q_5$ and $Q_6$ outputs of the two D-shaped flip-flops 198 and 199 are portrayed in the function table of FIG. 8B along with the W/V, X and Y function mode actuated states.

With the AC to square wave digital converter and regulator 155, edge detector 156, and the state control logic circuit 157 the circuit switch 33 selects the different operating patterns. The V, X, Y and W circuits are connected with brightness control V, testing X, emergency Y and automatic operation W. This is with each pattern having a lock circuit so that the state control logic circuit can via pulse signal outputs operate respective pattern outputs. With respect to the switch 33 after turn on the circuit stores sufficient power for short term on continuation of the auto pattern W. If the switch 33 is turned on and off, the brightness control pattern V is entered for use of the photo sensing element in detecting external brightness for brightness threshold actuation. If the external switch 33 is turned on-off-on two times the testing pattern X is actuated for detection and adjustment of infrared ray input circuitry. If the external switch 33 is turned on-off-on three times or more emergency function Y mode is actuated.

With reference now to the emergency state switch activated circuit of FIG. 9A and the realted family of waveforms of FIG. 9B the signal source N is connected through resistor 204 to ground and as a D input to D-shaped flip-flop 205 that has a timing clock input of 16 Hz. This flip-flop 205 aids in eliminating bounce in the N input signal waveform. The $\overline{Q}$ reverse phase B2 output from flip-flop 205 is an input to both NOR gates 206 and 208. The output of NOR gate 206 is an input to NOR gate 208 and also to NOR gate 207 receiving an S signal input and developing an output fed back as an input to NOR gate 206 with the NOR gates 206 and 207 being in effect an R-S flip-flop. The preset end of this flip-flop is connected for an 18K $H_2$ input signal. When the $\overline{Q}$ output of flip-flop 205 is at low voltage potential the output of NOR gate 208 is at a high voltage potential as a positive pulse out of, in effect, a one-shot generator. The emergency output of the state control circuit 157 and the output from NOR gate 208 through NOR gate 209 produce an output applied as the set input S of R-S flip-flop 210. The positive phase Q output of R-S flip-flop 210 is an input to AND gate 211 along with a 1 Hz input for producing an emergency B3 signal pattern out of AND gate 211.

With reference to the FIG. 9B waveforms with a positive pulse (square wave pulse) N the ascending edges and descending edges of the waveform give rise to undesired bounce. Therefore, application thereof to D-shaped flip-flop 205 along with a 16 Hz clock input results in a $\overline{Q}$ reverse phase output negative going pulse with its width approximately equal, or a little more than the N waveform pulse width with bounce (or debounce) eliminated. This results in a relatively narrow B1 pulse waveform output from NOR gate 208 with its leading edge coexistent with the descending edge of the B2 waveform. This results in D-shaped flip-flop 210 being actuated through NOR gate 209 with the low voltage potential of waveform B4 of the Q output of the flip-flop 210 changed to high voltage potential that is held for an extended time. This activates AND gate 211 so that the 1 Hz pulse input waveform thereto results in a like waveform B3 with a 0.5 second interval output. Thus, the light control circuit can be used in an emergency state flashing the light 22 with a continuing series of flashes.

Whereas this invention has been described with respect to a single embodiment thereof it should be realized that various changes may be made without departure from the essential contributions to the art made by the teachings hereof.

I claim:

1. A hot body intrusion activated light control unit with daylight sensing photocell deactivation override comprising: passive electromagnetic wave infrared detector means in an infrared radiation detector circuit; electromagnetic light wave sensing photocell means in photocell circuit means; illumination means; signal pattern selecting controller means having single key operation synthesizing the output of said infrared radiation detector circuit and the output of said photocell circuit means in function selecting control as an illumination control circuit for illumination control of said illumination means; relay switch means and relay driver means connected for on-off control of said illumination means connected to a controlling output of said signal pattern selecting controller means as a function selecting controller; test pattern detection and adjustment means adjusted for said infrared radiation detector circuit and including emergency pattern circuit means selecting various patterns one by one, and state control logic means with the power input to said emergency pattern circuit means including switch means in the power path to said emergency pattern circuit means that generate time signals fed to a signal waveform pulse edge detector with said time signals divided into two positive pulse outputs; ascending and descending waveform pulse edge detection by said signal waveform pulse edge detector detecting the activation number of said switch means, control input to said state control logic means with signal control of flip-flop means and logic gate circuit means for generating signal pulses for selection of an output from four outputs dependent on the number of pulses and activation of an output waveform sign determining the continuing pattern as a selection by the number of switch activations in a sequence of switching of said signal pattern selecting controller means.

2. The hot body intrusion activated light control unit with daylight sensing photocell deactivation override of claim 1, wherein said emergency pattern circuit means comprises: two T-shaped flip-flops, an R-S flip-flop, a NOT gate and a Schmitt buffer, with one of the T-shaped flip-flops being provided a preselected frequency input source that produces a positive phase output from the same flip-flop connected as a preset input of said R-S flip-flop; connection of the input of said emergency pattern circuit means with said Schmitt buffer and then with the superimposed terminals of said two T-shaped flip-flops and said R-S flip-flop; connection of an output of said R-S flip-flop in series with said NOT gate; input of said preselected frequency source signal as a timing signal input to said two T-shaped flip-flops, AC voltage signal circuit input means connected as an input to said R-S flip-flop for generating a waveform with a frequency less than said preselected frequency output with said AC voltage signal altered to saturated square waves through said Schmitt buffer, said two T-shaped flip-flops, and said R-S flip-flop so actuated to produce a low voltage potential waveform output changed to a high voltage potential through said NOT gate; with the high voltage potential held until elimination of the superimposed sign of said two T-shaped flip-flops; said two T-shaped flip-flops being circuit configured to count normally the number to present high voltage potential input at the presetted end of said R-S flip-flop; the circuit of said two T-shaped flip-flops and said R-S flip-flop generated output waveform sign extended time pulses dependent on the high or low voltage potential level of the input waveform signals.

3. The hot body intrusion activated light control unit with daylight sensing photocell deactivation override of claim 1, wherein said waveform pulse edge detecting means comprises: two D-shaped flip-flops detecting pulse fronts and pulse rear ends; two AND gates and two NOT gates; with said detector means receiving an input from said emergency pattern circuit means as an input to a first one of said two D-shaped flip-flops with the positive phase output thereof connected as a data input to the second of said D-shaped flip-flops; time pulse source means connected as a time pulse signal input to both of said D-shaped flip-flops; with positive phase outputs of said two D-shaped flip-flops being connected as inputs to said two AND gates, respectively, and with the positive phase outputs of said two D-shaped flip-flops connected as inputs, respectively, to said NOT gates with outputs, respectively, as inputs to said AND gates having UP and DOWN AND gate outputs, respectively; with said two D-shaped flip-flops generating output resultant waveforms consistent with input waveform data, using pitch difference between positive output end waveforms out of said two D-shaped flip-flops; said NOT gates with said AND gates producing outputs of said AND gates, respectively, positive going pulse waveforms corresponding to the ascending and descending edges of input waveform pulses for recording of the number of ascending edges and descending edges.

4. The hot body intrusion activated light control unit with daylight sensing photocell deactivation override of claim 1, wherein said signal pattern selecting controller means comprises: a divide by four counter including a T-shaped flip-flop, two D-shaped flip-flops and logic gate means, with descending waveform edges out of said edge detector means is applied through two branch lines to times input of said T-shaped flip-flop and to an input end of a NAND gate; the positive phase outputs and the reverse phase outputs of said T-shaped flip-flop are applied as inputs, respectively, to two AND gates with outputs actuating inputs to brightness control circuit means, and auto pattern circuit means, the other inputs of the two AND gates connected in common to the output of a NOR gate and the input of a first NOT gate with the output of said first NOT gate connected to the superimposed end of said T-shaped flip-flop; the output of said NAND gate connected along with the output of said edge detector means to the times input of said two D-shaped flip-flops of said divide by four counter; outputs of the positive phase and the reverse phase of said first D-shaped flip-flop are connected to the first inputs of two additional AND gates having second inputs and the positive output from said second D-shaped flip-flop connected together to provide with positive output from said second D-shaped flip-flop outputs from the two additional AND gates that are outputs connected as the actuating inputs to said test pattern detection and adjustment means circuit and said emergency pattern circuit means; further connection of said two outputs, respectively, to inputs of said NOR gate and with the input connection to the emergency pattern circuit means also connected through a second NOT gate to another input of said NAND gate, so that said NAND gate blanks input signals by the reverse phase action of said second NOT gate; when the emergency pattern circuit means is actuated and it is not receiving any input signal said T-shaped flip-flop is not receiving any signal, and the output connected with said auto pattern circuit means is at high voltage potential actuating this auto pattern circuit means to operate; said brightness control circuit means is actuated by state change of said T-shaped flip-flop after a pulse signal waveform has been inputted; when two continuous pulse waveforms are inputted, with counting result out of said two D-shaped flip-flops, the resulting output actuating said test pattern detection and adjustment means is at high voltage potential thereby making said test pattern detecting and adjusting means operate; if three or more continuous pulse waveforms are inputted the output connected to said emergency pattern circuit means is at high enough voltage potential to actuate said emergency pattern circuit means; the return effect of said NOT gate connected with the output to blank input and for locking an operational emergency pattern circuit operational state, and one of several outputs is selected dependent on the number of input waveform pulses for achieving the pulse selecting result required.

5. The hot body intrusion activated light control unit with daylight sensing photocell deactivation override of claim 1, wherein the actuated waveform state of said emergency pattern circuit means has two actuation sources: the state control logic of the system that is selected by the operating number of switching, and the externally actuated detector, wherein a positive pulse out makes the emergency pattern circuit means operate, with the bounce in its structure eliminated through a D-shaped flip-flop purifying waveform signal, then the reverse output of a D-shaped flip-flop is inputted to the superimposed end of said R-S flip-flop composed of two NOR gates and to the input of another NOR gate; the positive phase output of said R-S flip-flop is applied to another input of said NOR gate forming a one-shot circuit and then an input to the preset end of said R-S flip-flop at the times input with a high frequency being applied, so that one-shot electric circuit outputs a short pulse; an output of said state control logic circuit inputs a NOR gate and is then inputted to the preset input of said R-S flip-flop to achieve a locking signal effect, to then output an extended positive voltage potential level to drive the emergency pattern circuit means for achieving an external actuated effect.

6. The hot body intrusion activated light control unit with daylight sensing photocell deactivation override of claim 8, wherein after a pattern has been selected, the illumination control circuit outputs a brief indicating waveform sign for distinguishing the pattern, so that said illumination control circuit has the function state indication, the display structure using said edge detector to generate a corresponding ascending or descending edge of waveform pulses on opening or closing of said switch and then is removed by frequency remover means, and together with one half Hz sign generated by said frequency remover means are inputted respectively to the superimposed end and the preset end of said R-S flip-flop, so that said R-S flip-flop outputs with a positive pulse of one second width and then a one-shot electric circuit composed of NOR gates is inputted to generate a start pulse at the descending edge of a R-S flip-flop waveform pulse output to make another frequency remover counting from beginning, the times signs with one half Hz, one fourth Hz, one eighth Hz of said frequency remover are combined logically to generate a stop pulse with a six second delay; with said start and stop pulses inputted respectively to preset end and superimposed end of said R-S flip-flop, with said R-S flip-flop outputting a positive voltage potential interval; after which said positive directional pulse drives an automatic pattern circuit and said signal pattern selecting controller means, the indicating signs of two said patterns are taken directly from times signs with one eighth Hz and one half Hz, so that said automatic pattern circuit generates three positive pulses with one second intervals and said signal pattern selecting controller means generates a special indicating waveform signal with a high voltage potential for two seconds; said emergency pattern circuit means receives an actuating input from an AND gate and a times input with one Hz at its other input for outputting continual indicating waveform pulses of one half second intervals, and with the first six seconds of activation of said illuminating means used as a pattern indication by different indicating signs of said patterns.

7. The hot body intrusion activated light control unit with daylight sensing photocell detection override of claim 1, wherein a power supply AC to DC converter system supplies DC electric current; a voltage regulator primarily of transistors, reducing return flow of electric current during short periods of electric current cut-out and with its voltage division having high resistance reactance for reduced power consumption; and the return flow phenomenon of voltage regulation being reduced during input voltage power cut-out, with a high capacity wave filter capacitor.

8. The hot body intrusion activated light control unit with daylight sensing photocell detection override of claim 1, wherein said infrared radiation detector circuit and said photocell means are mounted in the inside of a housing behind a lens for protection from the environment.

* * * * *